United States Patent [19]
Chiang

[11] Patent Number: 5,332,929
[45] Date of Patent: Jul. 26, 1994

[54] POWER MANAGEMENT FOR PROGRAMMABLE LOGIC DEVICES

[75] Inventor: David Chiang, Saratoga, Calif.

[73] Assignee: Xilinx, Inc., San Jose, Calif.

[21] Appl. No.: 55,807

[22] Filed: Apr. 8, 1993

[51] Int. Cl.$^5$ ............................................. H03K 19/01
[52] U.S. Cl. ......................... 307/296.3; 307/465;
307/530; 365/189.08; 365/227
[58] Field of Search .................. 307/279, 530, 296.6,
307/465, 296.3; 365/196, 205, 189.08, 227;
328/104, 162

[56] References Cited

U.S. PATENT DOCUMENTS

| | | | |
|---|---|---|---|
| 4,107,556 | 8/1978 | Stewart et al. | 307/279 |
| 4,233,675 | 11/1980 | Kard et al. | 307/530 |
| 4,763,020 | 8/1988 | Takata et al. | 302/465 |
| 4,815,036 | 3/1989 | Kyomansu | 365/196 |
| 5,041,746 | 8/1991 | Webster et al. | 307/530 |
| 5,091,661 | 2/9192 | Chiang | 307/465 |
| 5,111,079 | 5/1992 | Steele | 365/189.08 |
| 5,250,859 | 10/1993 | Kaplinsky | 365/189.08 |
| 5,268,598 | 12/1993 | Pedersen et al. | 302/465 |

FOREIGN PATENT DOCUMENTS 2015152  9/1992  World Int. Prop. O. .......... 302/465

*Primary Examiner*—Timothy P. Callahan
*Assistant Examiner*—Dinh Le
*Attorney, Agent, or Firm*—Norman R. Klivans; Edel M. Young

[57] ABSTRACT

A programmable circuit is provided with a number of current regulating circuits, such as sense amplifiers, by which the user can regulate the amount of current drawn by any of a number of circuit functions within the programmable circuit. Additional current regulating circuits are associated with circuit elements which can be programmably shared between one or more circuit functions. The user can therefore programmably control the current consumption, and thereby the speed, of each circuit function as well as circuit functions interacting via the shared circuit elements.

15 Claims, 8 Drawing Sheets

POWER MANAGEMENT FOR PROGRAMMABLE LOGIC DEVICES

BACKGROUND OF THE INVENTION

This invention relates to the implementation of custom logic functions in an integrated circuit device and more particularly to the allocation of power resources therein.

DESCRIPTION OF THE PRIOR ART

Programmable Logic Devices (PLD's), notably those that are based on EPROM or EEPROM-based product terms, typically draw DC current. Some also have large internal drivers that may also draw large AC current during switching. Circuits that can draw substantial DC current include (1) EPROM sense amplifiers ("sense amps") which act as passive pullup devices on the EPROM bitlines in order to sense the logic state of the bitlines, and (2) gates with passive pullups (or pulldowns). There is a strong tradeoff relationship between the DC current drawn by a sense amp and its speed (performance); in general, the higher the current, the faster the circuit performance. It is also well known in the art that higher current through PLD circuits enables bit line capacitances to discharge faster, thereby increasing the speed of the circuit.

FIG. 1a illustrates the relationship between power and speed in a conventional EPROM sense amplifier. When biasing transistor 1 is switched on by voltage $V_{bias}$, the voltage of input line 2, determined by transistors 3, is sensed by the gate and drain of P-channel pullup transistor 4. (The gates of transistors 3 are each connected to the input signal terminal of the sense amp). Transistor 4 will turn on at a predetermined voltage input of (bit line) line 2 voltage, establishing a particular voltage for output line 5. By increasing voltage VDD On the source of transistor 4, all transistors 1, 3 and 4 draw more current, resulting in higher switching speeds, thereby increasing the speed of the circuit. Also, increasing the channel width of transistors 4, 1, and 3 draws more current and increases switching speed. The charge stored by the capacitance of bitline 2 discharges faster due to the increased current drawn by the circuit, enabling faster signal propagation.

FIG. 1b further illustrates the speed-power correlation for a conventional NOR gate circuit. Gate input signals a, b, c, d for respective transistors 7, 8, 9, 10 determine the voltage of line 6 and hence the NOR gate output. The P-channel pullup transistor 11 remains on until line 6 achieves a predetermined voltage. By increasing voltage $V_{DD}$ at the source of transistor 11, transistors 7, 8, 9, 10 and 11 draw more current, resulting in higher switching speeds, therefore enhancing the speed of the circuit. As described above, a large current enables fast discharge of bitline 6, enhancing signal propagation and thus circuit speed.

Higher speed circuits are desirable; however, there are many restrictions on how much current a device can draw. For example, with increasing device integration, the ability of the device package to dissipate heat (thermal resistivity) can limit the total power that can be dissipated without the internal junction temperatures reaching unreliable levels (generally considered to be about 150° C.). Another restriction may be that the circuit board on which the device is used has a limited power budget.

The tradeoff between power and speed can be made programmable in order to allow the best compromise to be made by the user. This is especially true for PLDs where the final application cannot be predicted at the time of fabrication. Xilinx, Inc. the assignee of the present invention, manufactures PLDS, a typical architecture of which is shown in FIG. 2. FIG. 2 shows an array of configurable logic blocks 12, 13, 14, 15 interconnected via an interconnect matrix (UIM) 16. The input lines 17 into logic block 12 are programmably combined into a number of AND gates 18 in the AND array 19. The output lines 20 are called product terms. Product terms 20 of each AND gate 18 of the AND array 19 are provided to one or more of a series of macrocells (MC) 21.

A typical prior art macrocell 21 architecture is shown in FIG. 3. Macrocell 21 configures the outputs (product terms 20) of AND array 19 of FIG. 2 and may perform additional logic on the output signals of AND array 19. In-line sense amps 20.1 on input lines 20.2 amplify the signals input to the macrocell 21. Macrocell 21 contains an OR gate 22 into which the product terms are gated, and a register (flip flop) 23 for storing the OR gate 22 output signal. Output line 24 of OR gate 22 and the output lines 23a and 23b of register 23 can be configured programmably by setting the multiplexers (MUXs) 25, 26 and 27 with control bits CB1 and CB2 on their control terminals 28, 29, and 30, each specifying the output state of the respective MUX. This prior art macrocell 21 does not feature any power management or speed control.

Power management has been proposed for EPLDs with simple macrocells in the literature, whereby a configuration bit is added to each macrocell to determine whether all the sense amps of a given macrocell are in "high-speed mode" (and hence higher power) or "low-power mode" (and hence lower speed). In particular, Altera, Inc. has made references to this capability in descriptions of its MAX 7000 architecture. However, this scheme is only possible in an architecture where the power consuming elements are all localized for each macrocell.

FIG. 4 shows an example of a prior art PLD architecture incorporating power management. Input lines 31 to macrocell N each have in-line sense amps 32 amplifying the input signals to the macrocell N. A single configuration bit $CB_n$ regulates the amount of amplification (power) provided for each input line 31. Macrocell N can function in either a high speed mode, corresponding to a high power setting, or a low speed mode, corresponding to a low power setting, as specified by setting the control bit $CB_n$. Each macrocell N is assigned one power management configuration bit $CB_n$ to allocate power only for those lines 31 which are in use by that macrocell, i.e. private resources. A similar structure is shown for macrocell N+1.

For more complex PLD architectures with shareable power consuming resources (such as product terms shareable between two or more macrocells), there are shared resources that cannot be assigned to any particular macrocell. Here, the simple single bit power management scheme of FIG. 4 is insufficient.

SUMMARY OF THE INVENTION

In accordance with the invention, elements of a programmable circuit are each powered by a current regulating circuit (such as a sense amp) by which the user can programmably (using configuration bits) regulate the current drawn by any of a number of the circuit elements within the programmable circuit. Additional current regulating circuits regulate circuit elements (input lines) which can be programmably shared between one or more circuit functions. The user can therefore programmably control the current consumption, and thereby the speed, of tasks performed by each circuit function as well as tasks performed by circuit functions interacting via the shared circuit elements.

Thus, in accordance with the invention, one or more power management configuration bits (PMCB) are assigned to the sense amps for shared resources (input lines) of a PLD, in addition to a single configuration bit per macrocell of a PLD for the sense amps associated with the private resources. This is implemented with particular sense amp circuits.

DETAILED DESCRIPTION OF THE INVENTION

Figure 5:
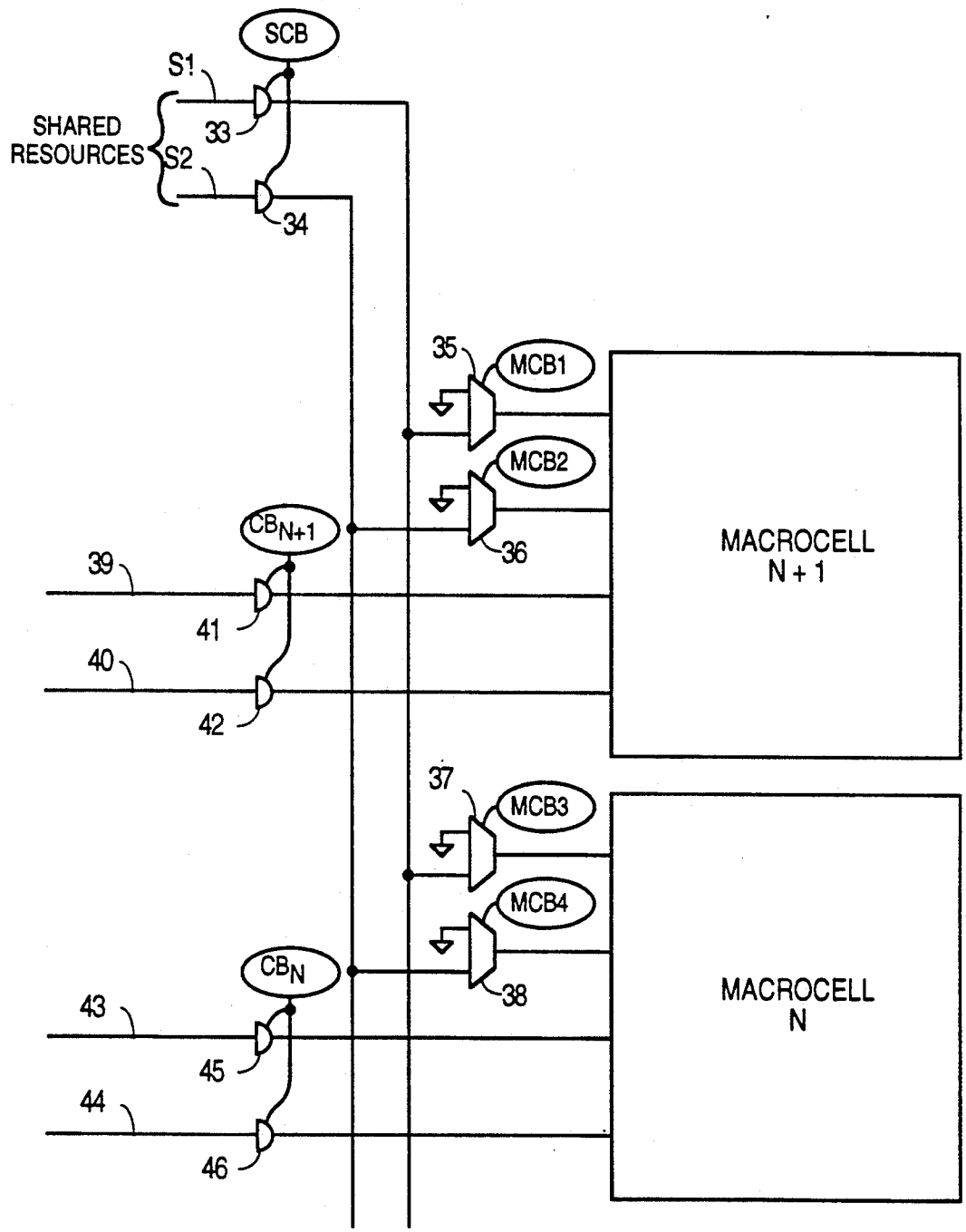
FIG. 5 is schematic of one embodiment of the present invention.

FIG. 5 shows a PLD architecture wherein power is allocated to resources (input lines) shared between two or more macrocells. Shared resources, lines S1 and S2, have respectively in-line sense amps 33 and 34 with their power supply voltage controlled by configuration bit SCB. Lines S1 and S2 are shareable between macrocells N+1 and N by way of programmable multiplexers 35, 36, 37, 38, controlled respectively by multiplexer configuration bits MCB1, MCB2, MCB3, MCB4. Sense amps 41, 42 are programmably controlled by "private" configuration bit $CB_{N+1}$ to provide power to respective private resource lines 39, 40 for macrocell N+1. Similarly, sense amps 45, 46 are programmably controlled by "private" configuration bit $CB_N$ to provide power to private resource lines 43, 44 for macrocell N.

Resource lines S1 and S2 are shared between macrocells N+1 and N by appropriately setting at least one of multiplexer configuration bits MCB1, MCB2 and at least one of multiplexer configuration bits MCB3, MCB4. If shared resource lines S1 and S2 are to be used for fast logical functions in macrocells N+1 and N, shared configuration bit SCB is set to configure sense amps 33, 34 to the high power state.

If shared resource lines S1 and S2 are shared between macrocells N+1 and N for normal speed functions, the shared configuration bit SCB is set to operate sense amps 33 and 34 in the low speed mode to economize power consumption. (It is to be understood that configuration bit SCB and the other configuration bits mentioned herein are conventionally programmably set by connected fuses, anti-fuses, EPROM cells, EEPROM cells, latches, or similar elements)

Since multiplexers 35, 36, 37, and 38 selectively configure the use of shared resource lines S1 and S2, high speed power consuming functions are configured among a minimal number of logic elements, thus economizing power usage while maintaining the flexibility of implementing high speed operation with shared resources.

It should be noted that the present invention encompasses embodiments having an arbitrary number of shared and private resource lines.

One embodiment for a complex EPLD applies to shareable product terms within a macrocell in which there are five product terms private to each macrocell and 12 shareable product terms, each of which may be used in any of 9 macrocells within a logic block. FIG. 6 shows this embodiment with macrocell 71 of the nine macrocells in the logic block. Each of the five private product terms 64, 65, 66, 67, 68 is controlled by a single power management control bit 69, with another power management control bit 70 controlling all the shareable product terms 72 in the macrocell. Multiplexers 73, ..., 84 select among the 12 shareable product terms 72 as specified by the setting of multiplexer configuration bits 73.1, ..., 84.1. In this embodiment, if there is at least one macrocell using a shareable product term configured for fast operation, then all shareable product terms are configured for fast operation.

Figure 6A:
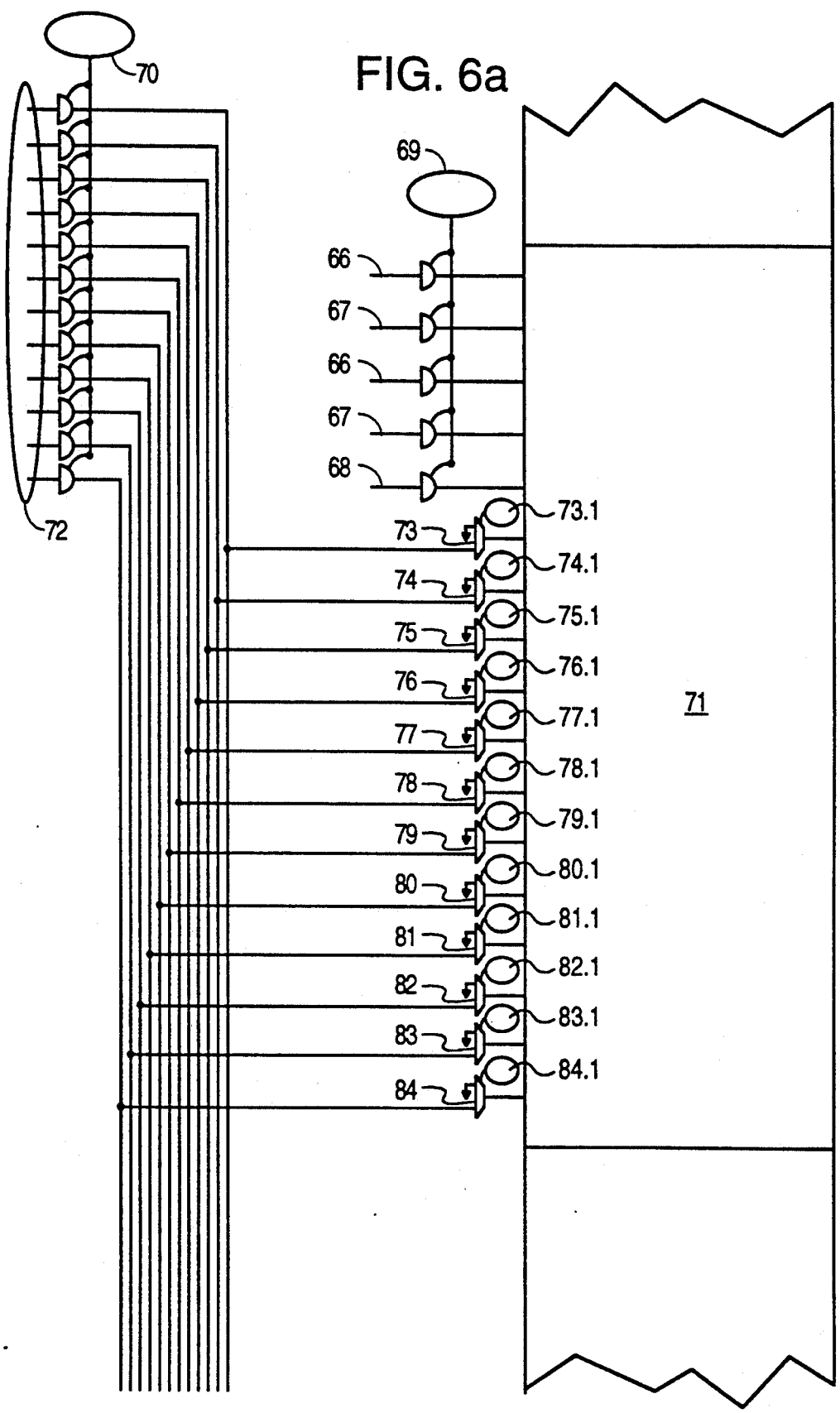
FIG. 6(a) is a schematic of another embodiment of the present invention.
Figure 6B:
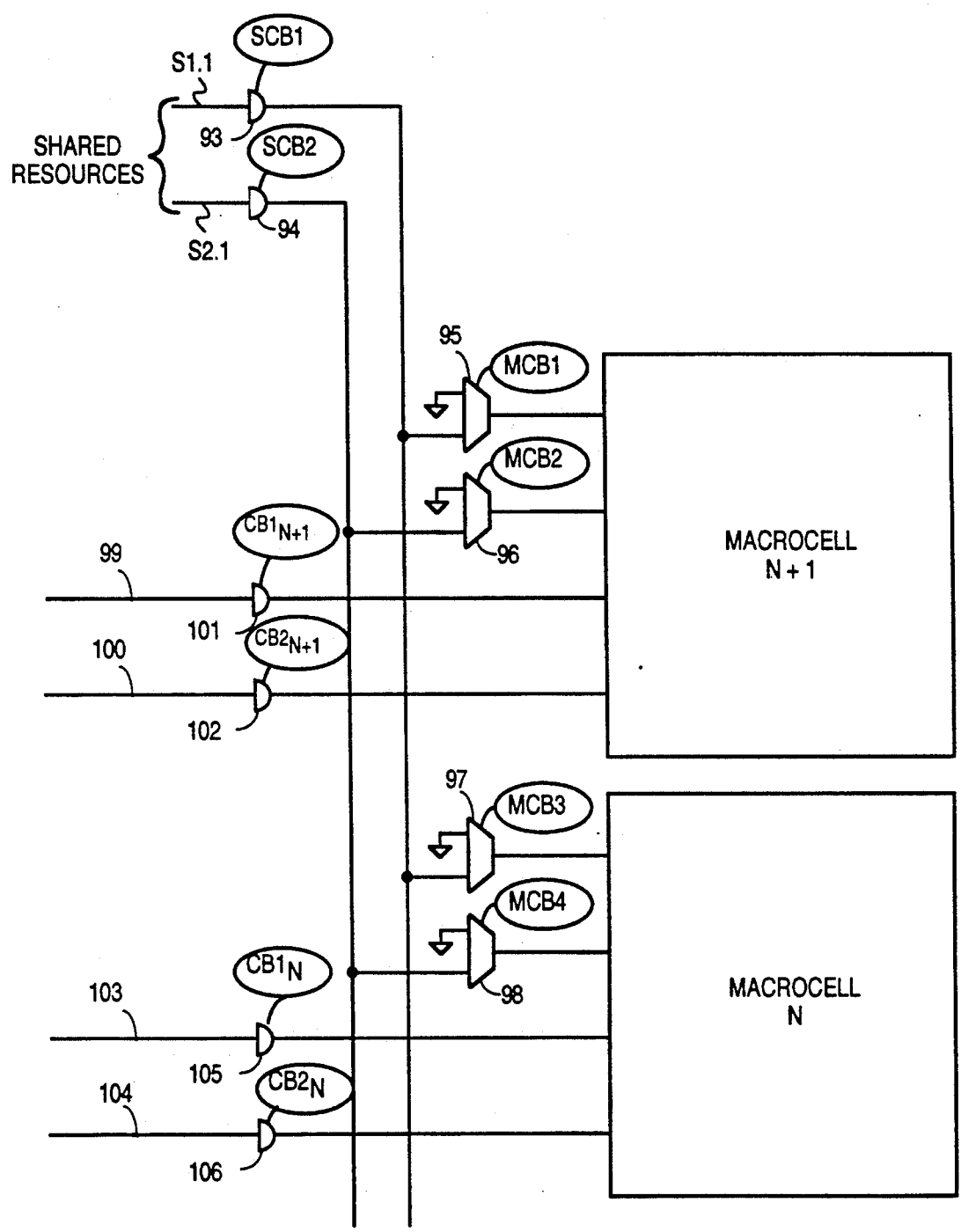
FIG. 6(b) is a schematic of another embodiment of the present invention.

A variation of the circuit of FIG. 6(a) above uses a separate PMCB for each private and each shareable resource line, as shown in FIG. 6(b). Configuration bits SCB1 and SCB2 control the sense amplifiers 93 and 94 of the shared resource lines S1.1 and S2.1. For macrocell N+1, configuration bits $CB1_{N+1}$ and $CB2_{N+1}$ control the sense amps 101 and 102 for private resource lines 99 and 100. For macrocell N, configuration bits $CB1_N$ and $CB2_N$ control the sense amps 105 and 106 for private resource lines 103 and 104. Providing a separate configuration bit for each private line and shared line sense amp allows even more precise control of speed and power consumption.

Figure 7:
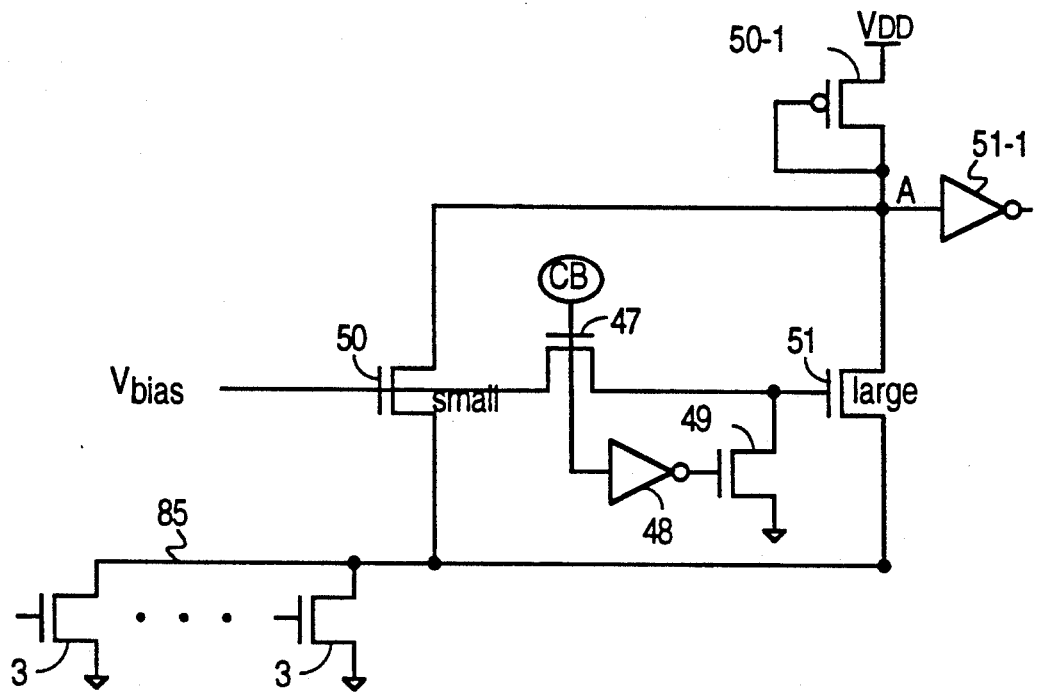
FIG. 7 is a circuit diagram of a sense amp used in one embodiment of the present invention.

FIG. 7 shows a sense amp (as used in the circuits of FIGS. 6(a) and 6(b)) programmable for setting power consumption and hence speed, in accordance with the invention. Voltage $V_{bias}$ is usually at approximately 3 volts, thereby turning on transistor 50 which has a relatively small active (channel region) area. Configuration bit CB (which is the bit SCB or CB of FIG. 5) controls the gate of transistor 47 and connects to the input of inverter 48. The output of inverter 48 connects to the gate of transistor 49. When the control bit CB is low (typically at ground) current from bit line 85 flows through transistor 50. However, when the configuration bit CB is set (high state) transistor 47 is turned on, enabling voltage $V_{bias}$ to charge the gate of large transistor 51, thereby allowing more current to flow between node 85 and node A through both of transistors 50 and 51. Large transistor 51 has a relatively large active area. Transistor 49 grounds the gate of the large transistor 51 when configuration bit CB is set low. Pullup P-type transistor 50-1 is connected to supply voltage $V_{DD}$.

It is to be understood that other programmable sense amps are also usable in accordance with the invention.

Figure 1A:
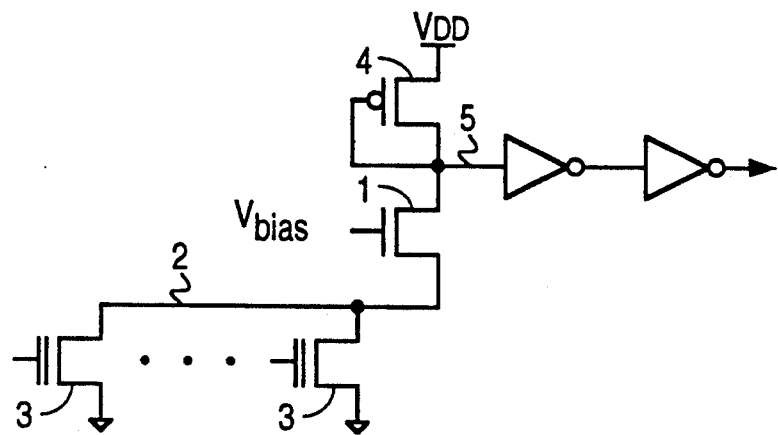
FIG. 1a is a circuit diagram of a prior art sense amp.
Figure 1B:
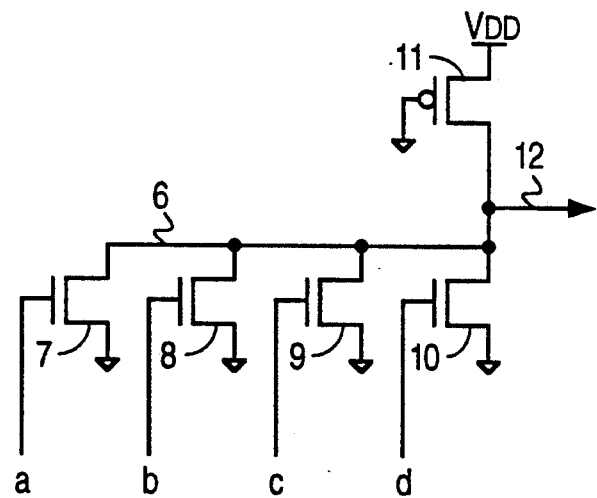
FIG. 1b is a circuit diagram of a prior art NOR gate.
Figure 2:
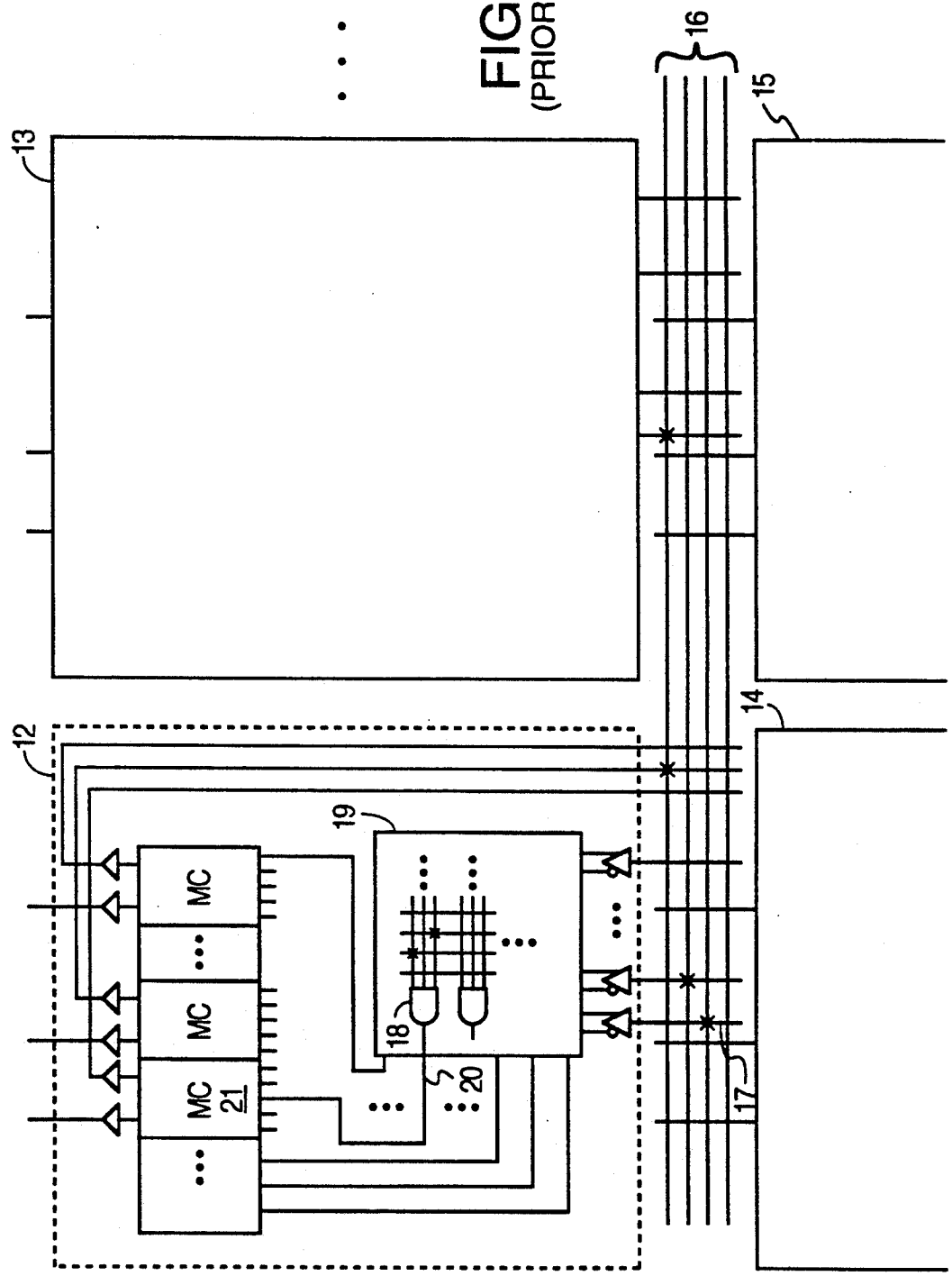
FIG. 2 is a block diagram of a prior art PLD architecture.
Figure 3:
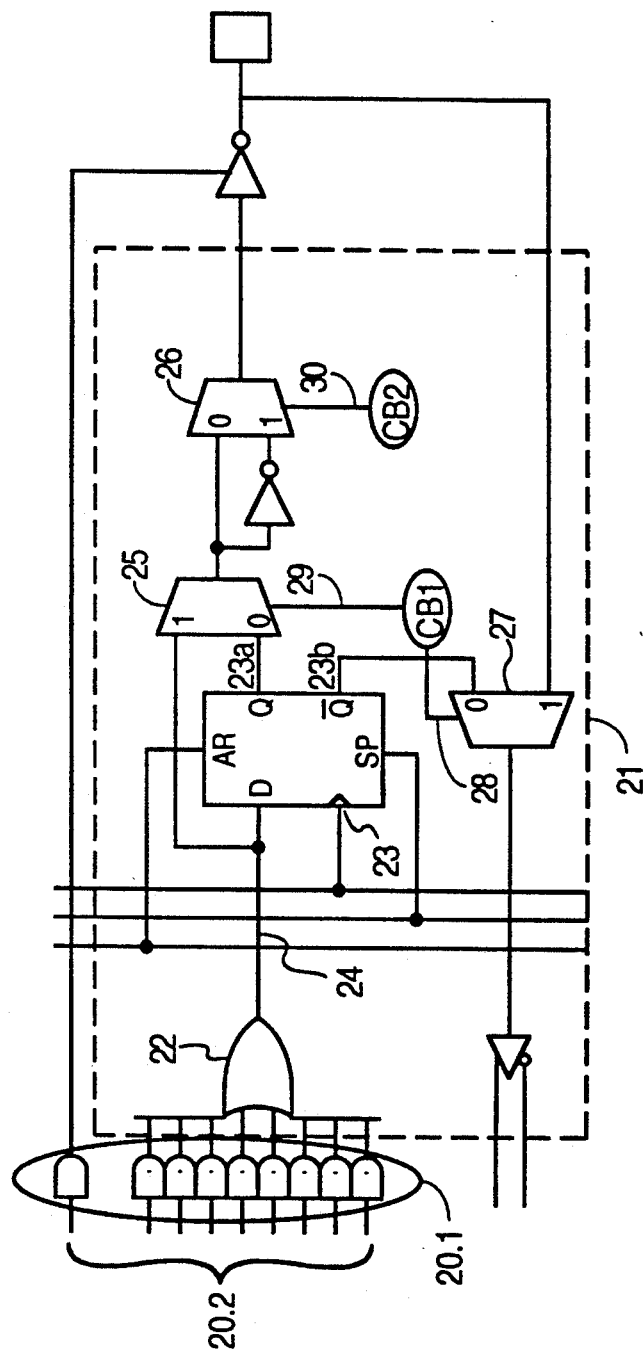
FIG. 3 is a circuit diagram of a prior art macrocell.
Figure 4:
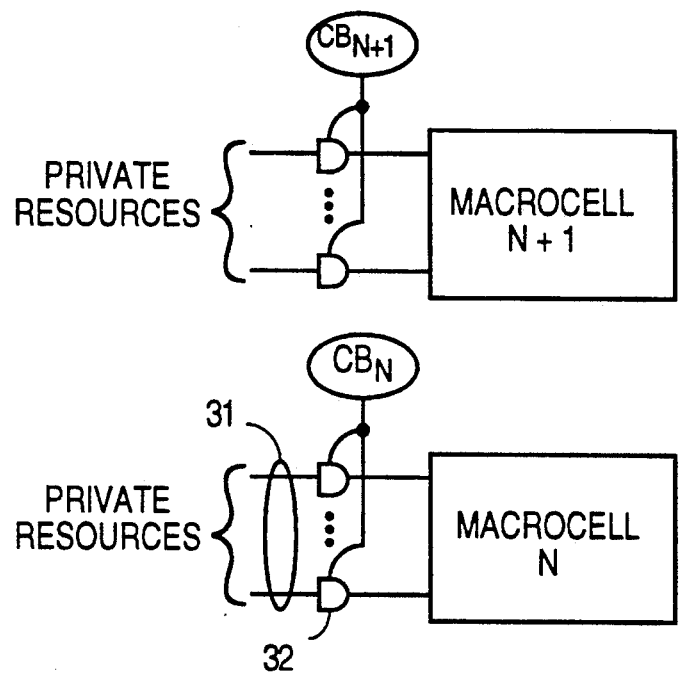
FIG. 4 is a block diagram of a prior art PLD power management circuit.

The above-described power management scheme is extendable to circuits that draw large AC currents as well, such as large internal drivers (such as drivers for the central switching matrix, for example). In a PLD, such large internal drivers (typically standard CMOS inverters) drive the interconnect matrix (UIM) 16 of FIG. 2. Large transient AC power supply currents are created when these internal drivers switch while drawing large current. Providing a current limiting power management control bit for these drivers reduces the transient AC power supply currents if the driver is not involved in high speed operation. Since each UIM driver (see lines 20 in FIG. 2) can drive more than one macrocell, each UIM driver is a shareable resource, and hence a power management configuration bit may be assigned to each UIM driver much like the case of FIG. 6a. The configuration bit modifies the operation of the driver circuit such that the total AC current during switching is reduced, but with a resulting slower switching speed. Power management of the UIM drivers may be handled by the circuit of FIG. 8.

Figure 8:
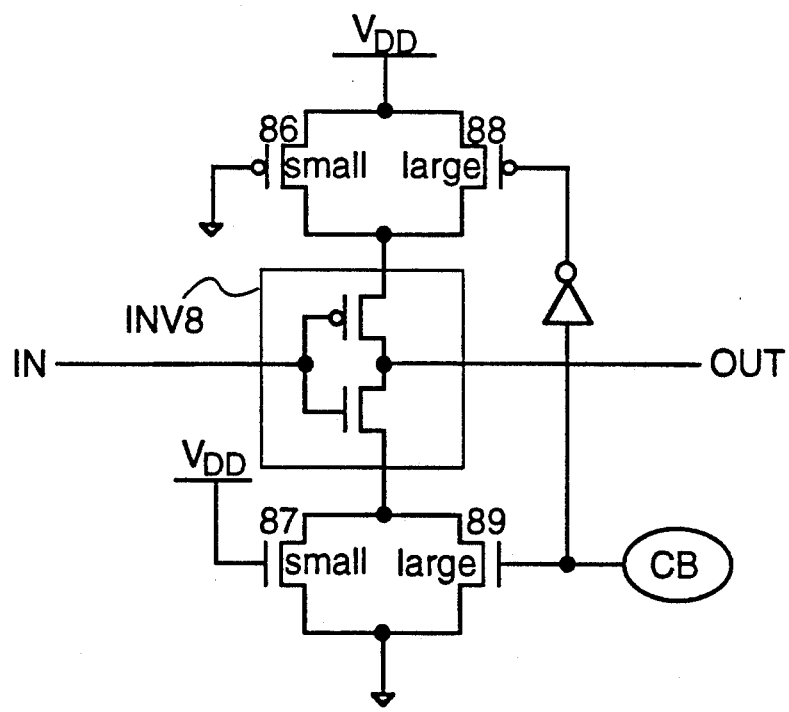
FIG. 8 is a large driver circuit of the present invention with power management.

FIG. 8 shows an alternative driver circuit with programmable power management. Supply voltage VDD is applied to the source terminal of P-channel transistor 86. Ground voltage is applied to N-channel transistor 87. Thus transistors 86 and 87 are always on and supply drive to inverter INV8. But transistors 86 and 87 are small in channel width, and thus consume only a low current during switching. When current is supplied only by transistors 86 and 87 the driver is in a low-current low-speed mode. In addition, large P-channel transistor 88 is provided in parallel with transistor 86, and large N-channel transistor 89 is provided in parallel with transistor 87. Transistors 88 and 89 are controlled by the CB signal, a high CB signal turning on both transistors 88 and 89 and a low CB signal turning off transistors 88 and 89. Thus a low CB signal causes inverter INV8 to operate in a low-speed low-current mode (with reduced noise) and a high CB signal causes inverter INV8 to operate in a high-speed, high power mode (with higher switching noise). Other embodiments can provide N-channel transistor 89 without P-channel transistor 88. With two control signals such as CB, transistors 88 and 89 can be controlled separately for further choice of power level.

This disclosure is illustrative and not limiting; further modifications will be apparent to one skilled in the art and are intended to fall within the scope of the appended claims. For example, the above discussion relates to drivers for a UIM, however the same power management can be used for other purposes which use shared resources.

I claim:

1. A programmable circuit comprising:
 a plurality of circuit blocks for performing logic functions on input signals, each block receiving the input data signals on at least one private input line connected to that block and to no other block, and on at least one shared input line also connected to at least one other block;
 at lest one current regulating circuit for regulating said at least one shared input line, each current regulating circuit having two states, a first state causing said at least one shared input line to output a first current for providing a first operation speed of a logic function of a data signal thereon and a second state causing said at least one shared input line to output a second current greater than the first for providing a second higher operation speed of said logic function of the same data signal thereon; and
 a control circuit for setting the state of the current regulating circuit.

2. The programmable circuit of claim 1, wherein the control circuits includes a single memory element for storing a configuration bit for setting the state of the current regulating circuit.

3. the programmable circuit of claim 1, wherein each current regulating circuit is a sense amplifier.

4. A programmable circuit according to claim 3 wherein said sense amplifier comprises:
 a first signal line;
 a second signal line;
 a circuit coupled between said first signal line and said second signal line, said circuit switchable between a low resistance state and a high resistance state.

5. A programmable circuit acccording to claim 3 wherein each said sense amplifier comprises:
 a first current drawing element coupled between a shared input line and a line which is branched to circuit blocks sharing said shared input line, said first current drawing element switchable between an open circuit resistance state and a predetermined high resistance state; and
 a second current drawing element coupled between a shared input line and a line which is branched to circuit blocks sharing said shared input line, said second current drawing element switchable between an open circuit state and a predetermined low resistance state.

6. A programmable circuit according to claim 3 wherein each said sense amplifier comprises:
 a first transistor having a first terminal and a second terminal, said first transistor having a gate;
 a second transistor having a first terminal and a second terminal, said second transistor having a gate;
 a first bit line connected to said first terminals of said first and second transistors;
 a second bit line connected to said second terminals of said first and second transistors;
 a third transistor having a first terminal connected to said second transistor gate, and a second terminal connected to said first transistor gate, said third transistor having a gate;
 an inverter having an input terminal and an output terminal, said input terminal connected to said third transistor gate;
 a fourth transistor having a first terminal connected to ground and a second terminal connected to said second transistor gate, said fourth transistor having a gate connected to said inverter output terminal;
 a first voltage terminal connected to said second terminals of said first and second transistors providing power to said first and second transistors;
 a second voltage terminal connected to said first transistor gate to provide a bias voltage for said first transistor; and
 a control terminal connected to said third transistor gate.

7. A programmable circuit comprising:
 a plurality of electrical circuits, each electrical circuit having a plurality of private resource input lines, each said private input line having a private line current regulating circuit, each said electrical circuit having a plurality of shared resource input terminals, each private line current regulating circuit having a control terminal;

a plurality of private configuration circuits each associated with one of said electrical circuits, each said private configuration circuit connected to the control terminal of each of said private line current regulating circuits of said associated electrical circuit, each said private configuration circuit having two programmable states, the first causing said private line current regulating circuit of said associated electrical circuit to operate at a first current level, the second causing said private line current regulating circuits of said associated electrical circuit to operate at a second current level higher than the first;

a plurality of shared lines, each of said plurality of shared lines having a shared line current regulating circuit, each shared line current regulating circuit having a control terminal;

a shared configuration circuit connected to each of said shared line current regulating circuit control terminals, said shared configuration circuit having two programmable states, the first causing said shared line current regulating circuit of said associated electrical circuit to operate at the first current level, the second causing said shared line current regulating circuit of said associated electrical circuit to operate at the second higher current level; and a plurality of programmable switches, each having an input terminal and an output terminal, said output terminals of each said switch connected to an associated shared resource input terminal, said input terminal of each switch connected to an associated shared line, each of said switches having two programmable states, the first causing an open circuit between said associated resource line and said associated shared resource input terminal, the second causing a closed circuit between said associated shared resource line and said associated shared input terminal.

8. A programmable circuit according to claim 7 wherein said electrical circuits are configurable macrocells.

9. A programmable circuit according to claim 8 wherein said private line current regulating circuits and said shared line current regulating circuits are each sense amplifiers.

10. A programmable circuit comprising:
a plurality of electrical circuit elements, each electrical circuit element having a plurality of private resource input lines, each said private input line having a private line current regulating circuit, each said electrical circuit element having a plurality of shared resource input terminals, each private line current regulating circuit having a control terminal;

a plurality of private configuration circuits each connected to the control terminal of an associated private line current regulating circuit, each said private configuration circuit having two programmable states, the first causing said associated private line current regulating circuit to operate at a first current level, the second causing said associated private line current regulating circuit to operate at a second current level higher than the first;

a plurality of shared lines, each of said plurality of shared lines having a shared line current regulating circuit, each shared line current regulating circuit having a control terminal;

a plurality of shared configuration circuits, each connected to the control terminal of an associated shared line current regulating circuit, each of said shared configuration circuits having two programmable states, the first causing said associated shared line current regulating circuit to operate at a first current level, the second causing said associated shared line current regulating circuit to operate at a second current level higher than the first; and a plurality of programmable switches, each having an input terminal and an output terminal, said output terminals of each said switch connected to an associated shared resource input terminal, said input terminal of each switch connected to an associated shared line, each of said switches having two programmable states, the first causing an open circuit between said associated resource line and said associated shared resource input terminal, the second causing a closed circuit between said associated shared resource line and said associated shared input terminal.

11. A programmable circuit according to claim 10 wherein said electrical circuits are configurable macrocells.

12. A programmable circuit according to claim 11 wherein said private line current regulating circuits and said shared line current regulating circuits are each sense amplifiers.

13. A method of regulating signal propagation speed and power consumption in an integrated circuit comprising:
coupling a plurality of circuit elements from a first signal line to ground;
connecting a supply voltage line to a second signal line;
coupling a second signal line to said first signal line with a first current drawing element and a second current drawing element, said first current drawing element switchable between an open circuit resistance state and a predetermined high resistance state, said second current drawing element switchable between an open circuit state and a predetermined low resistance state; and
regulating current flow by selectively switching said current drawing elements, selecting a low speed low power mode by switching said first current drawing element to said predetermined high resistance state and switching said second current drawing element to said open circuit state, selecting a high speed high power mode by switching of said second current drawing element to said predetermined low resistance state and switching said first current drawing element to said open circuit state.

14. A method of regulating signal propagation speed and power consumption in an integrated circuit having a plurality of blocks, each block receiving signals on a plurality of private input lines connected to that block and to no other block, and a plurality of shared input lines also connected to at least one other block, comprising:
providing an individual current regulating circuit for each private input line and each shared input line;
providing a first control circuit for setting a state of the current regulating circuit for at least one of the private input lines for a particular block;

providing a second control circuit for setting a state of the current regulating circuit for at least one of the shared input lines for the particular block; and operating each of the first and second control circuits in one of two states, a first state being a high current output by the associated current regulating circuit, and a second state being a lower current output by the associated current regulating circuit.

15. An integrated circuit comprising:

a plurality of blocks, each block receiving signals on a plurality of private input lines connected to that block and to no other block, and a plurality of shared input lines also connected to at least one other block;

an individual current regulating circuit for each private input line and each shared input line;

a first control circuit setting a state of the current regulating circuit for at least one of the private input lines for a particular block; and a second control circuit setting a state of the current regulating circuit for at least one of the shared input lines for the particular block;

wherein each of the first and second control circuits operates in one of two states, a first state being a high current output by the associated current regulating circuit, and a second state being a lower current output by the associated current regulating circuit.

* * * * *

UNITED STATES PATENT AND TRADEMARK OFFICE
CERTIFICATE OF CORRECTION

PATENT NO. : 5,332,929
DATED : July 26, 1994
INVENTOR(S) : David Chiang It is certified that error appears in the above-identified patent and that said Letters Patent is hereby corrected as shown below:

Title page, item [56],
In References cited, second citation, "Kard" should read --Karp--.

In References cited, fourth citation, "Kyomansu" should read --Kyomasu--.

In References cited, sixth citation, "2/9192" should read --2/1992--.

Col. 1, line 37, "VDD" should read --$V_{DD}$--.

Col. 1, line 38, "On" should read --on--.

Col. 2, line 6, "PLDS" should read --PLDs--.

Claim 1, col. 5, line 58, "lest" should read --least--.

Claim 2, col. 6, line 4, "circuits" should read --circuit--.

Claim 3, col. 6, line 7, "the" should read --The--.

Signed and Sealed this

Twenty-sixth Day of September, 1995

*Attest:*

BRUCE LEHMAN

*Attesting Officer*     *Commissioner of Patents and Trademarks*